US011163015B2

(12) United States Patent
Weeks et al.

(10) Patent No.: US 11,163,015 B2
(45) Date of Patent: *Nov. 2, 2021

(54) POWER PEDESTAL, GROUND FAULT INDICATION SYSTEM, AND PRINTED CIRCUIT BOARD ASSEMBLY THEREFOR

(71) Applicant: EATON INTELLIGENT POWER LIMITED, Dublin (IE)

(72) Inventors: Cory Robert Weeks, Hampton, VA (US); Paul D. Seff, Williamsburg, VA (US); Jason D. Easton, Williamsburg, VA (US); Nilesh Ankush Kadam, Pune (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 16/890,178

(22) Filed: Jun. 2, 2020

(65) Prior Publication Data
US 2020/0292628 A1 Sep. 17, 2020

Related U.S. Application Data

(63) Continuation of application No. 16/278,955, filed on Feb. 19, 2019, now Pat. No. 10,705,156.

(51) Int. Cl.
*G01R 31/50* (2020.01)
*G01R 31/40* (2020.01)
(Continued)

(52) U.S. Cl.
CPC ............. *G01R 31/50* (2020.01); *G01R 31/40* (2013.01); *G08B 5/36* (2013.01); *H02H 1/0007* (2013.01);
(Continued)

(58) Field of Classification Search
None
See application file for complete search history.

(56) References Cited

U.S. PATENT DOCUMENTS

| 4,519,657 A * | 5/1985 | Jensen | H02B 1/50 |
| | | | 174/38 |
| 5,184,279 A * | 2/1993 | Horn | H02B 1/50 |
| | | | 174/38 |

(Continued)

OTHER PUBLICATIONS

Anonymous: "Earth-fault indicator type Easl", Retrieved from the Internet: URL:https://web.archive.org/web/20180702221540if/http://www.emg-ger.com:80/index.ph p/en/component/jdownloads/send/8-easie/224 -datasheet-easi-a-rev6e [retrieved on Apr. 6, 2020] 4 pp.
(Continued)

*Primary Examiner* — Thomas S Mccormack
(74) *Attorney, Agent, or Firm* — Eckert Seamans Cherin & Mellott, LLC

(57) ABSTRACT

A printed circuit board assembly is for a ground fault indication system of a power pedestal. The power pedestal includes a housing. The ground fault indication system has a number of ground fault input devices each structured to be coupled to the housing. The printed circuit board assembly includes an enclosure, a number of terminals each coupled to the enclosure, at least one of the number of terminals being structured to be electrically connected with one of the number of ground fault input devices, and a printed circuit board enclosed by the enclosure and electrically connected to the number of terminals. The printed circuit board has an indication apparatus structured to provide an indication of circuit status.

20 Claims, 7 Drawing Sheets

(51) Int. Cl.
*G08B 5/36* (2006.01)
*H02H 1/00* (2006.01)
*H05K 1/18* (2006.01)
*H05K 7/14* (2006.01)
*H02H 3/16* (2006.01)

(52) U.S. Cl.
CPC ........... *H05K 1/181* (2013.01); *H05K 7/1427* (2013.01); *H02H 3/16* (2013.01); *H05K 2201/10106* (2013.01); *H05K 2201/10151* (2013.01)

(56) References Cited

U.S. PATENT DOCUMENTS

| | | |
|---|---|---|
| 5,611,616 A | 3/1997 | Chandler |
| 2017/0250532 A1 | 8/2017 | Seff et al. |
| 2018/0366940 A1* | 12/2018 | Violo ................... H02H 3/165 |

OTHER PUBLICATIONS

European Patent Office, "International Search Report and Written Opinion" from corresponding PCT/EP2020/025066, Apr. 17, 2020, 14 pp.

* cited by examiner

POWER PEDESTAL, GROUND FAULT INDICATION SYSTEM, AND PRINTED CIRCUIT BOARD ASSEMBLY THEREFOR

CROSS REFERENCE TO RELATED APPLICATION

This application is a continuation application of and claims priority to U.S. patent application Ser. No. 16/278,955, filed Feb. 19, 2019, the disclosures of which are incorporated herein by reference.

BACKGROUND

Field

The disclosed concept relates generally to power pedestals. The disclosed concept also relates to ground fault indication systems for power pedestals. The disclosed concept further relates to printed circuit board assemblies for ground fault indication systems.

Background Information

Electrical components (e.g., without limitation, receptacles, relays, circuit breakers, electrical meters, transformers, light fixtures, telephones, telephone and/or internet service lines, and television cables) used outdoors are typically housed within an enclosure, such as, for example, a power pedestal, to protect the electrical components from the environment and to prevent electrical faults caused by moisture. Power pedestals generally comprise an upstanding housing, the base of which is disposed on a suitable foundation (e.g., platform), and is structured to receive, for example and without limitation, power cables, telephone lines, television cables, internet service lines, and water service lines. The housing is made from a weather-resistant material, such as a suitable plastic or metal (e.g., without limitation, stainless steel), and is designed to enclose the power cables, lines and other cables, and the electrical components, receptacles and connectors which are electrically connected to the lines, in order to shield and protect them from the environment. Accordingly, power pedestals are well suited for use in environments such as marinas and recreational vehicle (RV) parks, where they must remain outdoors exposed to environmental elements as they serve to provide plug-in power and/or connectivity (e.g., without limitation, telephone service; Internet service; cable television; water service), for example, for boats and RVs and other vehicles.

Power pedestals commonly include many components (e.g., timers, control relays, and/or terminal relays) that function together to provide indications to users of various circuit states (e.g., safe state, tripped notifying state) of the power pedestal. Assembling and maintaining the many components requires significant labor and cost.

It is therefore desirable to provide an improved power pedestal, ground fault indication system, and printed circuit board assembly therefor.

SUMMARY

These needs and others are met by embodiments of the invention, which are directed to an improved power pedestal, ground fault indication system, and printed circuit board assembly therefor.

As one aspect of the disclosed concept, a printed circuit board assembly is provided for a ground fault indication system of a power pedestal. The power pedestal includes a housing. The ground fault indication system has a number of ground fault input devices each structured to be coupled to the housing. The printed circuit board assembly includes an enclosure, a number of terminals each coupled to the enclosure, at least one of the number of terminals being structured to be electrically connected with one of the number of ground fault input devices, and a printed circuit board enclosed by the enclosure and electrically connected to the number of terminals. The printed circuit board has an indication apparatus structured to provide an indication of circuit status.

As another aspect of the disclosed concept, a ground fault indication system for a power pedestal is provided. The power pedestal has a housing. The ground fault indication system comprises a number of ground fault input devices each structured to be coupled to the housing, and a printed circuit board assembly comprising a printed circuit board having an indication apparatus. The printed circuit board is electrically connected to each of the ground fault input devices in order to receive an input of circuit status therefrom, and in response, generate an indication of the circuit status with the indication apparatus.

As another aspect of the disclosed concept, a power pedestal including a housing and the aforementioned ground fault indication system is provided.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
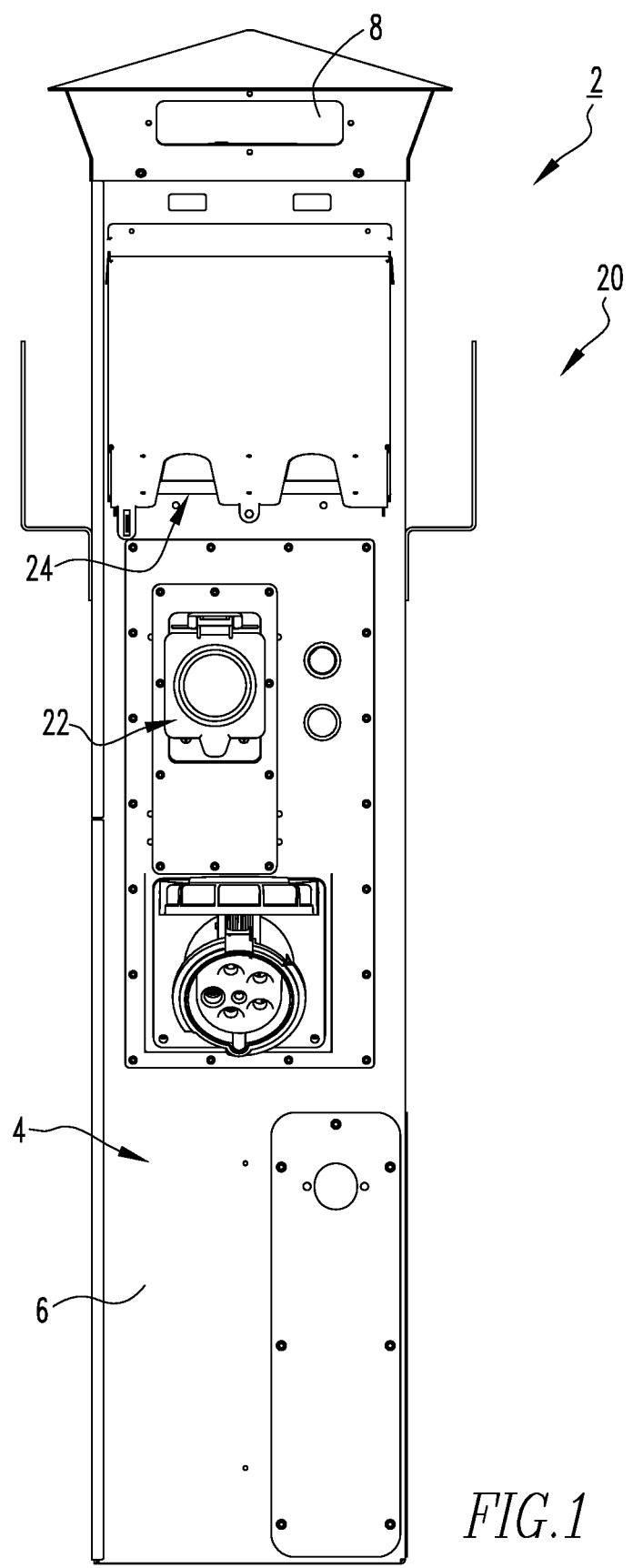
FIG. 1 is a front elevation view of a power pedestal and ground fault indication system therefor, in accordance with one non-limiting embodiment of the disclosed concept.
Figure 2:
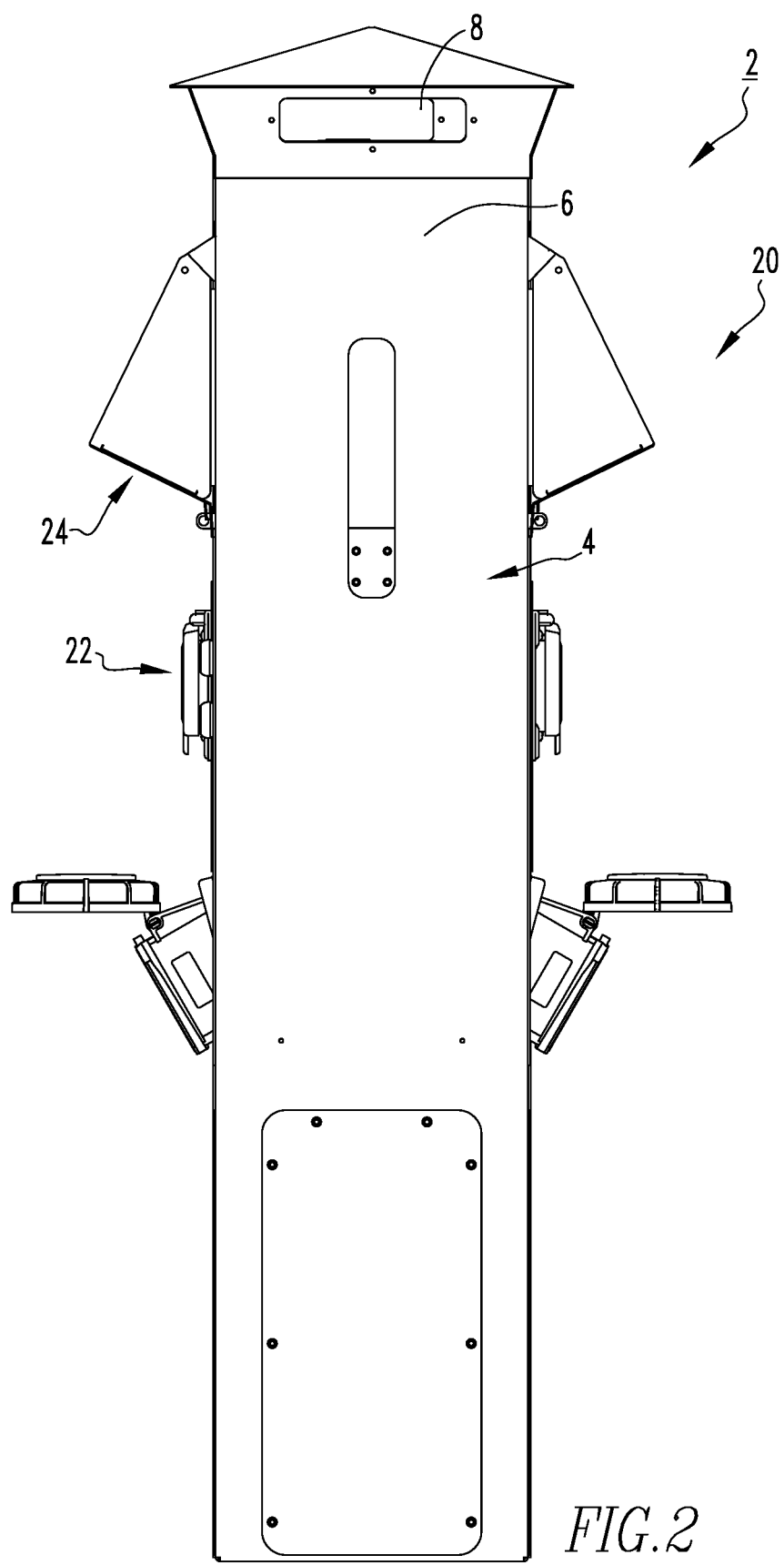
FIG. 2 is a right side elevation view of the power pedestal and ground fault indication system therefor of FIG. 1.
Figure 3:
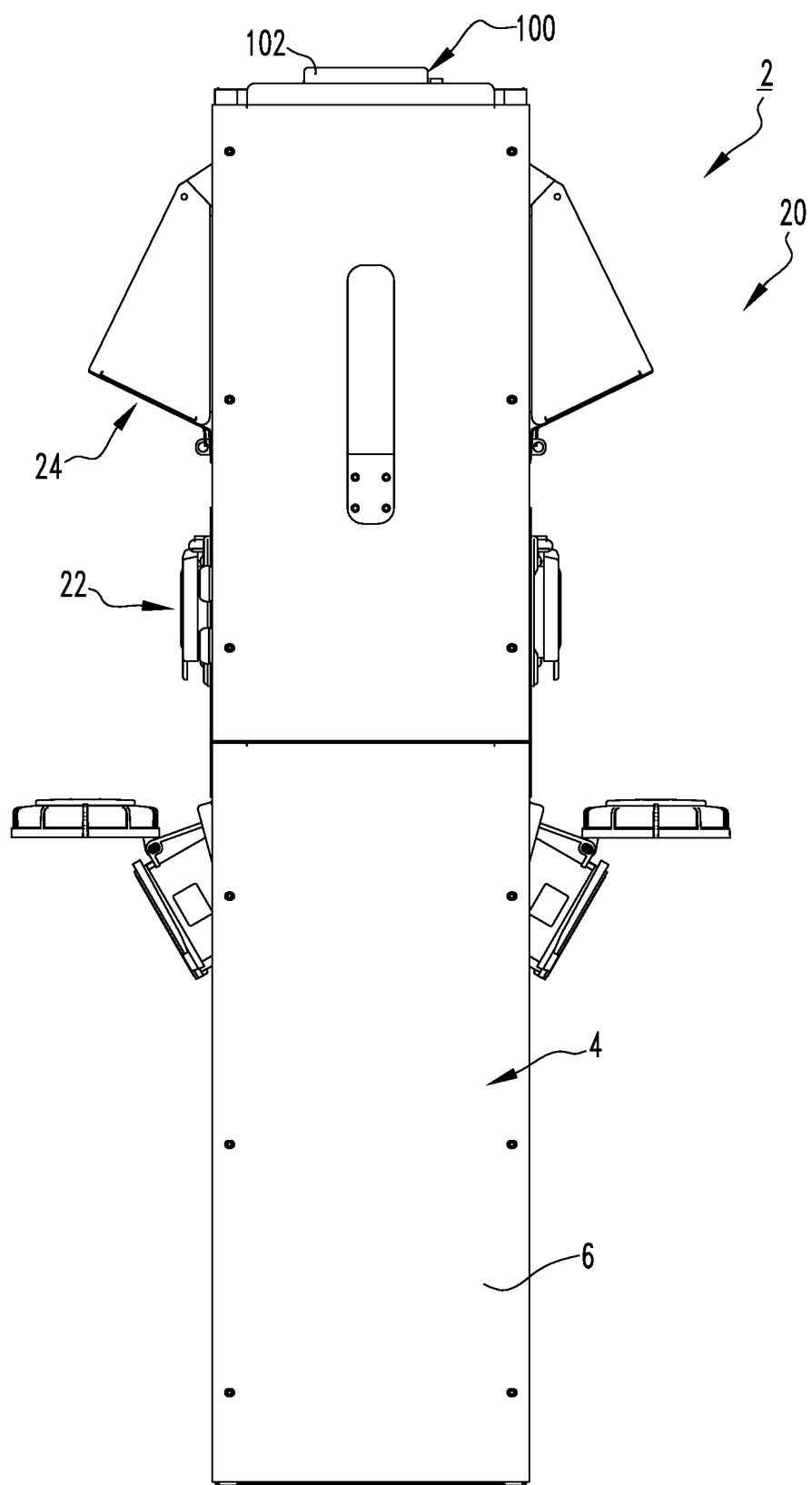
FIG. 3 is another right side elevation view of the power pedestal and ground fault indication system therefor of FIG. 1, shown with a portion of the housing removed in order to see hidden structures.
Figure 4:
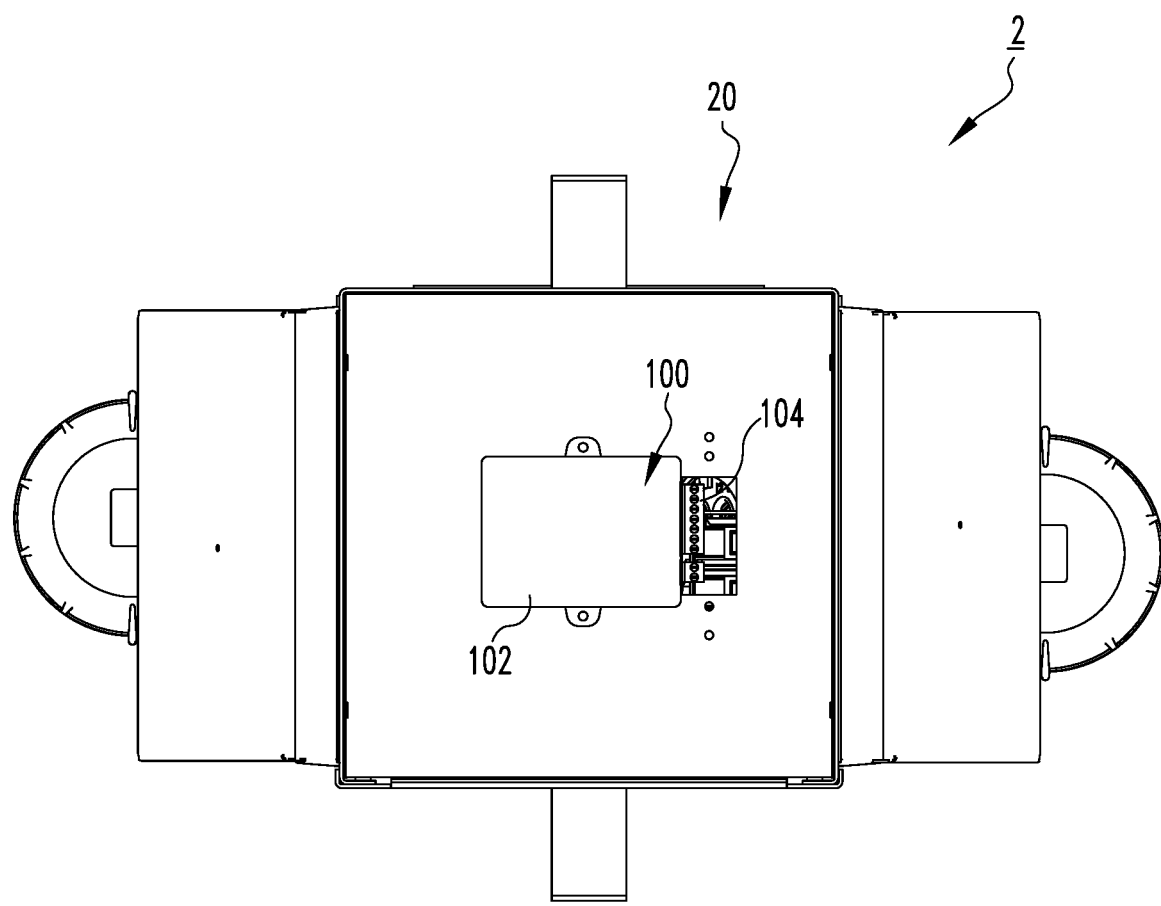
FIG. 4 is a top view of the power pedestal and ground fault indication system therefor of FIG. 3.

As employed herein, the singular form of "a", "an", and "the" include plural references unless the context clearly dictates otherwise. Still further, as used herein, the term "number" shall mean one or an integer greater than one (e.g., a plurality).

As employed herein, the term "coupled" shall mean that two or more parts are joined together directly or joined through one or more intermediate parts. Furthermore, as employed herein, the phrase "directly coupled" shall mean that two or more parts are joined together directly, without any intermediate parts being disposed therebetween at the point or location of the connection.

FIGS. 1-4 are different views of a power pedestal 2 and ground fault indication system 20 therefor, in accordance with one non-limiting embodiment of the disclosed concept. The power pedestal 2 has a housing 4 that includes a body portion 6 and a lens 8 coupled to the body portion. In one example embodiment, and for purposes that will be more apparent below, the lens 8 is transparent. That is, the lens 8 may be structured to allow substantially all visible light to pass therethrough. The ground fault indication system 20 includes a number of ground fault input devices such as, for example and without limitation, a ground fault sensing unit 22 and a ground fault circuit breaker 24. In one example embodiment, the ground fault sensing unit 22 is a D64 Ground Fault Relay, manufactured by Eaton Intelligent Power Limited, headquartered at 30 Pembroke Road, Dublin 4, Ireland. In accordance with the disclosed concept, the ground fault indication system 20 further includes a printed circuit board assembly 100 (partially shown in FIGS. 3 and 4) configured to aggregate circuit inputs of the power pedestal 2 and in response, generate an indication of circuit status.

Figure 5:
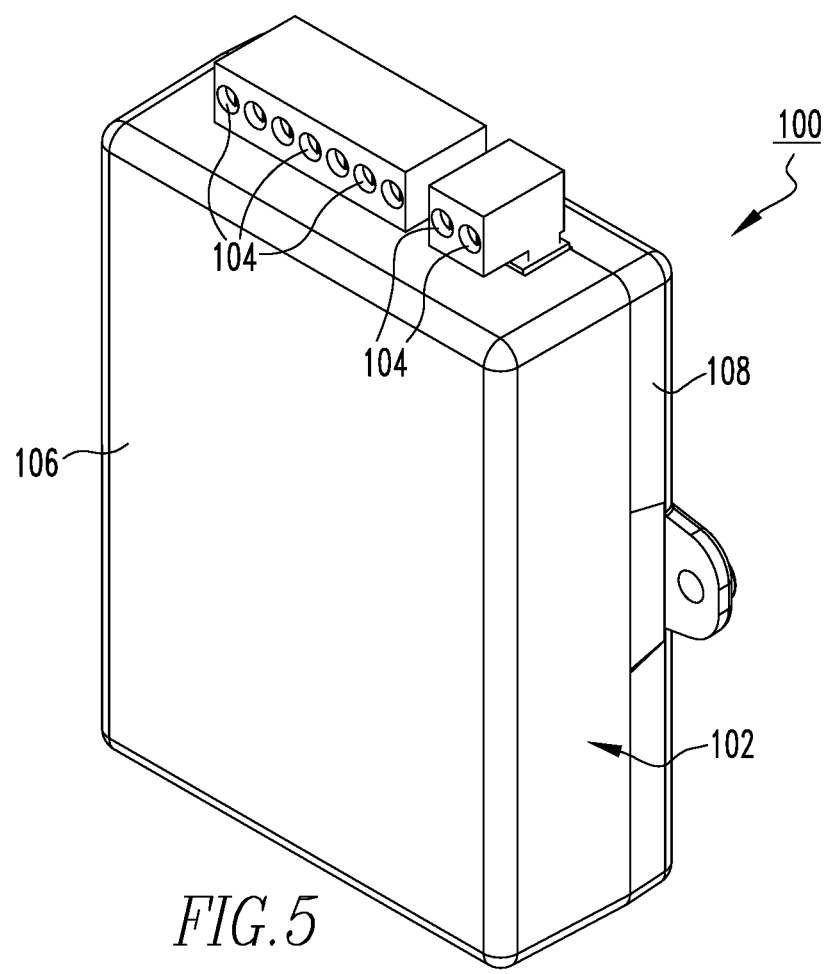
FIGS. 5, 6, and 7 are isometric, top, and exploded isometric views, respectively, of a printed circuit board assembly for the power pedestal and ground fault indication system therefor of FIG. 4.
Figure 6:
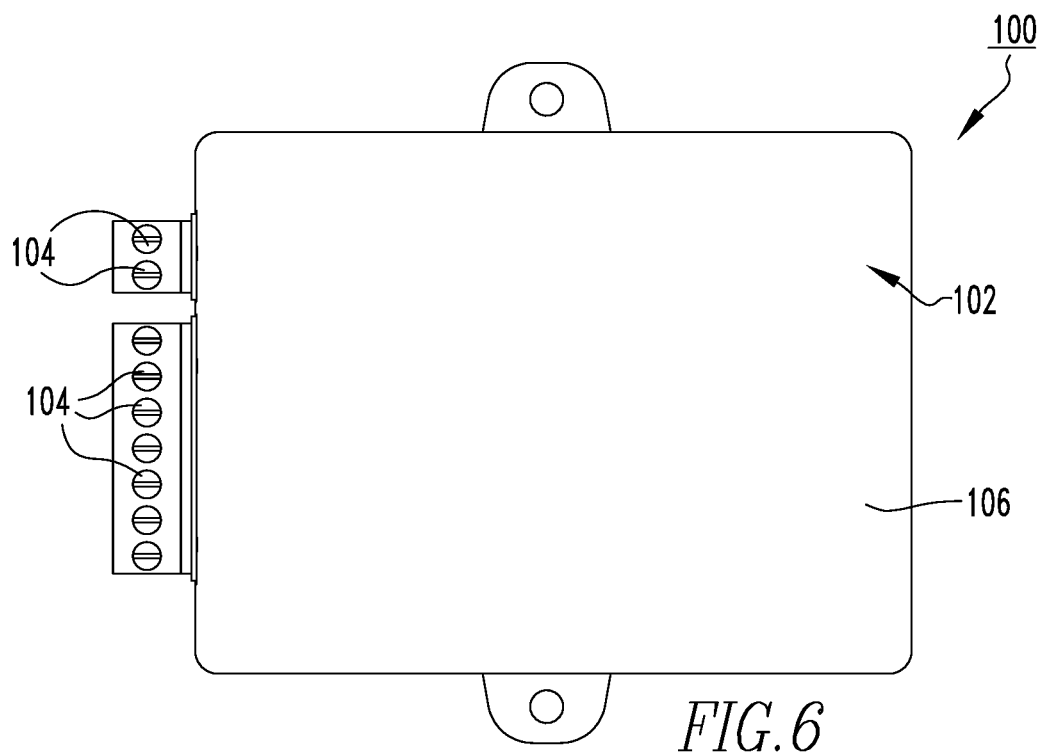

FIGS. 5 and 6 show different views of the printed circuit board assembly 100. As shown, the printed circuit board assembly 100 includes an enclosure 102 and a number of terminals 104 each coupled to the enclosure 102. The enclosure 102 is preferably substantially transparent (e.g., structured to allow substantially all visible light to pass therethrough), although this is not apparent in the FIGS. for purposes of illustration. Additionally, the enclosure 102 may be made of any suitable material (e.g., without limitation, a polycarbonate material). The enclosure 102 can generally be stated as including a first enclosure member 106 and a second enclosure member 108 coupled to the first enclosure member 106. The first and second enclosure members 106,108 may be coupled by, for example and without limitation, a snap-fit mechanism and/or via coupling members (not shown).

Figure 7:
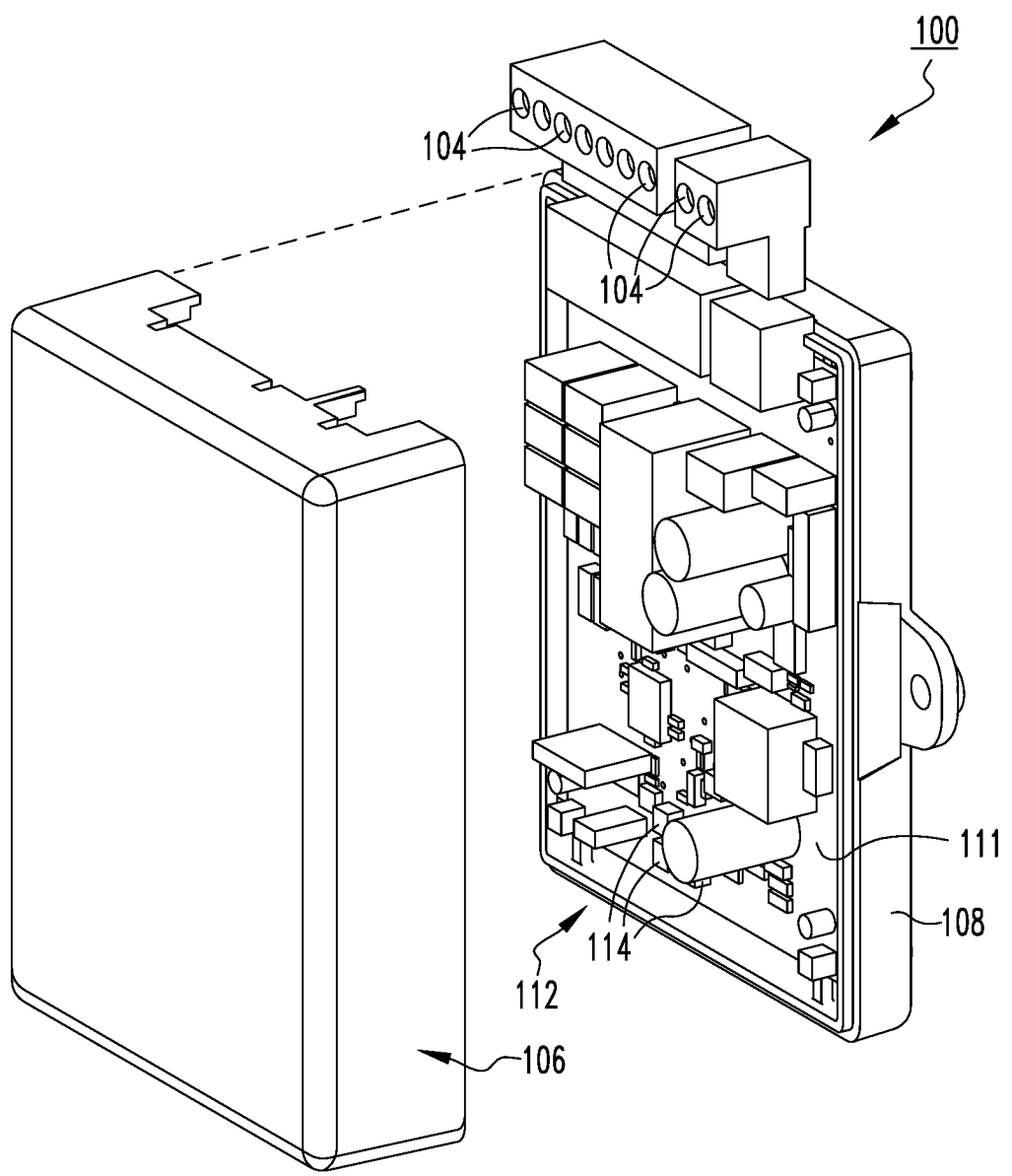

In one example embodiment, the terminals 104 are electrically connected to the ground fault sensing unit 22 and the ground fault circuit breaker 24 in order to receive indications of circuit status within the power pedestal 2. FIG. 7 shows an exploded isometric view of the printed circuit board assembly 100. As shown, enclosed by the first and second enclosure members 106,108 is a printed circuit board 110. The printed circuit board 110 is electrically connected to the terminals 104.

Figure 8:
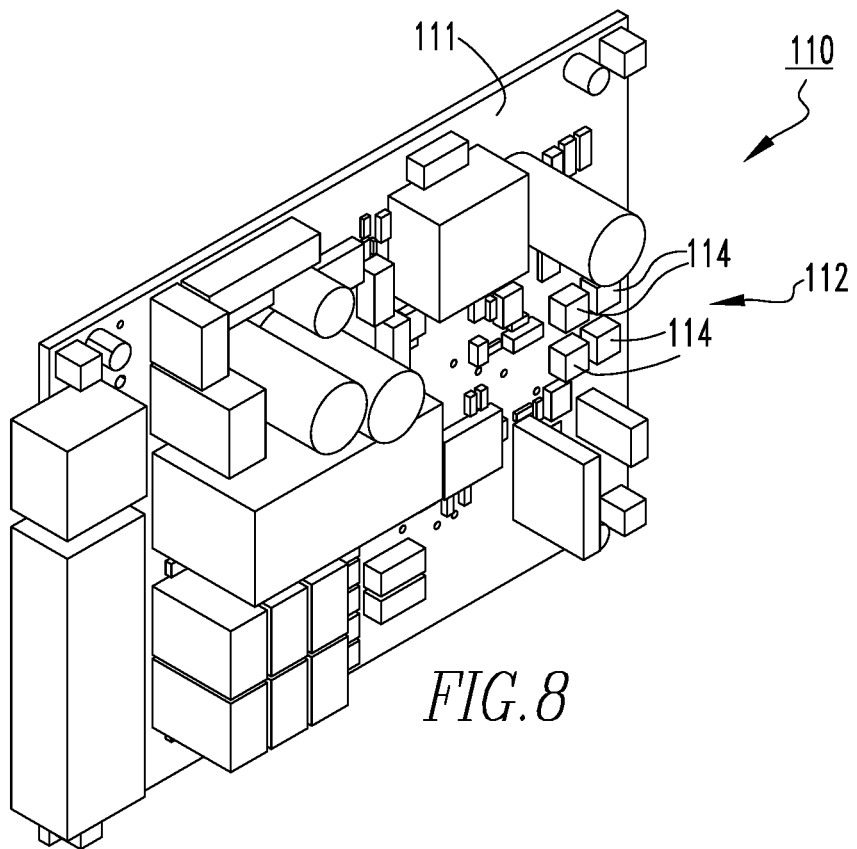
FIGS. 8 and 9 are isometric and top views, respectively, of a printed circuit board for the printed circuit board assembly of FIGS. 5 and 6.
Figure 9:
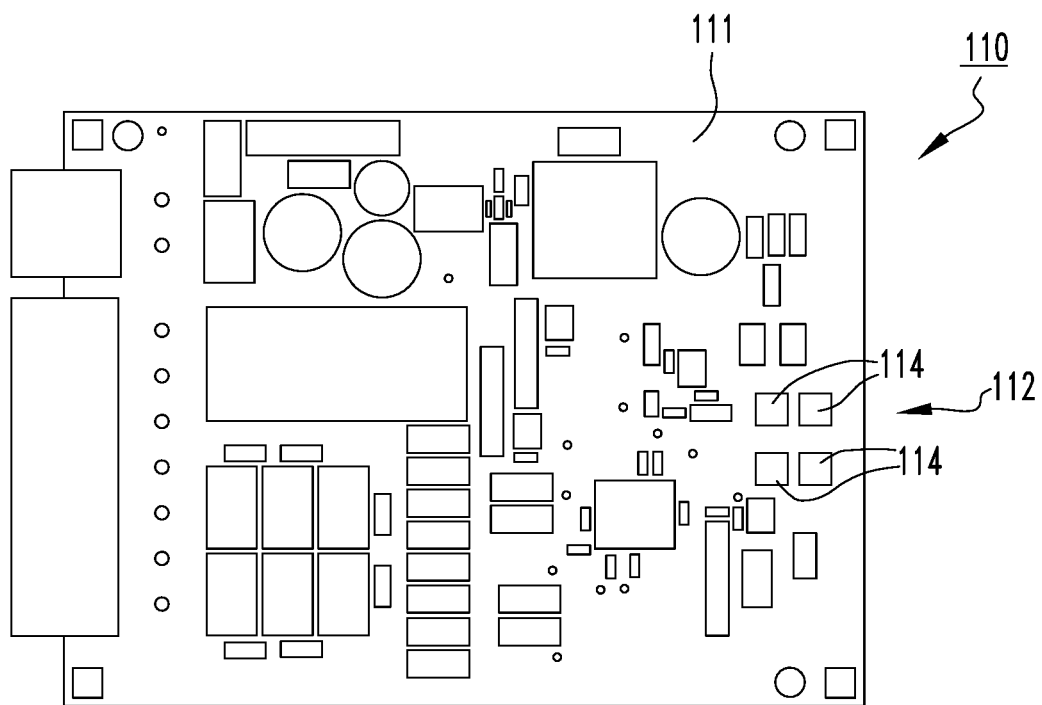

Additionally, FIGS. 8 and 9 show different views of the printed circuit board 110, which is electrically connected to the ground fault sensing unit 22 and the ground fault circuit breaker 24 in order to receive an input of circuit status therefrom, and in response, generate an indication of circuit status with an indication apparatus 112. As shown, the printed circuit board 110 has a board member 111 and the indication apparatus 112 located on the board member 111. In one example embodiment, the indication apparatus 112 includes a number of light emitting diodes (four example light emitting diodes 114 are shown in FIGS. 8 and 9). It will be appreciated that the indication apparatus 112 is advantageously structured to provide the indication of circuit status.

More specifically, because the printed circuit board 110 is electrically connected to the ground fault sensing unit 22 and the ground fault circuit breaker 24, the printed circuit board 110 takes inputs from these devices, and translates logic into either a SAFE state or a TRIPPED NOTIFYING state via the indication apparatus 112. Specifically, the indication of circuit status provided by the indication apparatus 112 may include an illumination of at least one of the light emitting diodes. Additionally, as mentioned above, the enclosure 102 of the printed circuit board assembly 100 is preferably substantially transparent. As a result, the indication of circuit status from the light emitting diodes 114 is able to visibly pass through the enclosure 102. Furthermore, as can be appreciated from FIGS. 2 and 3, the printed circuit board assembly 100 is configured to be positioned such that visible light can readily pass from the printed circuit board assembly 100 through the lens 8. Although the lens 8 is shown as being solid in the FIGS. (e.g., for ease of illustration), it will be appreciated that the lens 8 is substantially transparent and positioned proximate the printed circuit board assembly 100. In one example embodiment the lens 8 is positioned directly in front of the printed circuit board assembly 8, with respect to the orientation of FIG. 2. As a result, the indication of circuit status (e.g., a SAFE state or a TRIPPED NOTIFYING state) from the indication apparatus 112 (FIGS. 8 and 9) is able to visibly pass through the lens 8 and to the exterior of the power pedestal 2, thus notifying operators nearby of said circuit status.

In accordance with disclosed concept, the ground fault indication system 20 of the power pedestal 2 is able to provide indications of circuit status to operators, e.g., users standing proximate the power pedestal 2 who can look at the lens 8, thus alerting them of potential problems. Moreover, the ground fault indication system 20 is able to do so via a simple component, the printed circuit board 110. This is distinct from prior art indication systems, which typically require a conglomeration of separate parts, components, and wires. For example, many prior art power pedestals require separate timers, control relays, terminal relays, and wiring associated therewith, in order to provide circuit status indications. By way of contrast, in one example embodiment the ground fault indication system 20 is advantageously able to provide indications of circuit status (e.g., a SAFE state or a TRIPPED NOTIFYING state) by being devoid of a component selected from the group consisting of a timer, a control relay, and a terminal relay. In another example embodiment, the ground fault indication system 20 is devoid of each of these components, e.g., timers, control relays, and terminal relays. As a result of this consolidation of components into the printed circuit board 110, the power pedestal 2 is significantly less expensive, and requires less labor to assemble and maintain. For example, manufacturers will generally be able to more easily assemble and perform maintenance on the power pedestal 2, as compared to prior art power pedestals, due to the more simple design and usage of the printed circuit board 110.

Accordingly, it will be appreciated that the disclosed concept provides for an improved (e.g., without limitation, easier to assemble and perform maintenance on, and less expensive) power pedestal 2, ground fault indication system 20, and printed circuit board assembly 100 therefor, in which indications of circuit status are able to be provided via a printed circuit board 110, rather than through a large number of expensive additional components.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A printed circuit board assembly for a ground fault indication system of a power pedestal, the power pedestal comprising a housing, the ground fault indication system comprising a number of ground fault input devices that are situated on the housing, the ground fault indication system being devoid of timers, control relays, and terminal relays, the printed circuit board assembly comprising:
   an enclosure;
   a number of terminals situated on the enclosure, at least one terminal of the number of terminals being structured to be electrically connected with a ground fault input device of the number of ground fault input devices;
   an indication apparatus; and
   a printed circuit board enclosed by the enclosure and electrically connected with the number of terminals, the printed circuit board being structured to receive as an input a circuit status from the ground fault input device and being further structured to cause the indication apparatus to output an indication of circuit status responsive to the circuit status.

2. The printed circuit board assembly of claim 1 wherein the indication apparatus comprises a number of light emitting diodes.

3. The printed circuit board assembly of claim 2 wherein the number of light emitting diodes is a plurality of light emitting diodes.

4. The printed circuit board assembly of claim 2 wherein the enclosure is substantially transparent, and wherein the number of light emitting diodes are situated on the printed circuit board.

5. A ground fault indication system for a power pedestal, the power pedestal comprising a housing, the ground fault indication system comprising:
   a number of ground fault input devices each structured to be coupled to the housing; and
   a printed circuit board assembly comprising:
      an enclosure;
      a number of terminals each situated on the enclosure, at least one terminal of the number of terminals being structured to be electrically connected with a ground fault input device of the number of ground fault input devices;
      an indication apparatus;
      a printed circuit board enclosed by the enclosure and electrically connected with the number of terminals, the printed circuit board being structured to receive as an input a circuit status from the ground fault input device and being further structured to cause the indication apparatus to output an indication of circuit status responsive to the circuit status; and
   wherein the ground fault indication system is devoid of timers, control relays, and terminal relays.

6. The ground fault indication system of claim 5 wherein the indication apparatus comprises a number of light emitting diodes, and wherein the indication comprises an illumination of at least one light emitting diode of the number of light emitting diodes.

7. The ground fault indication system of claim 5 wherein the number of ground fault input devices comprises at least one ground fault circuit breaker.

8. The ground fault indication system of claim 5 wherein the number of ground fault input devices comprises at least one ground fault sensing unit.

9. The printed circuit board assembly of claim 5 wherein the indication apparatus comprises a number of light emitting diodes.

10. The printed circuit board assembly of claim 9 wherein the enclosure is substantially transparent, and wherein the number of light emitting diodes are situated on the printed circuit board.

11. The ground fault indication system of claim 5 wherein the circuit status comprises one of a safe state and a tripped notifying state.

12. A power pedestal comprising:
   a housing; and
   a ground fault indication system comprising:
      a number of ground fault input devices each structured to be coupled to the housing; and
      a printed circuit board assembly comprising:
         a number of terminals each situated on the enclosure, at least one terminal of the number of terminals being structured to be electrically connected with a ground fault input device of the number of ground fault input devices;
         an indication apparatus; and
         a printed circuit board electrically connected with the number of terminals, the printed circuit board being structured to receive as an input a circuit status from the ground fault input device and being further structured to cause the indication apparatus to output an indication of circuit status responsive to the circuit status; and
      wherein the ground fault indication system is devoid of timers, control relays, and terminal relays.

13. The power pedestal of claim 12 wherein the printed circuit board assembly further comprises an enclosure, the printed circuit board being enclosed by the enclosure, and wherein the housing comprises a lens that is transparent, the enclosure being situated proximate the lens.

14. The power pedestal of claim 13 wherein the indication apparatus comprises a number of light emitting diodes.

15. The power pedestal of claim 14 wherein the indication comprises an illumination of at least one light emitting diode of the number of light emitting diodes.

16. The power pedestal of claim 12 wherein the number of ground fault input devices comprise at least one ground fault circuit breaker.

17. The power pedestal of claim 12 wherein the number of ground fault input devices comprise at least one ground fault sensing unit.

18. The power pedestal of claim 12 wherein the circuit status comprises one of a safe state and a tripped notifying state.

19. The power pedestal of claim 12 wherein the indication apparatus comprises a number of light emitting diodes.

20. The power pedestal of claim 19 wherein the indication comprises an illumination of at least one light emitting diode of the number of light emitting diodes.

* * * * *